United States Patent
Vergossen

(10) Patent No.: US 10,741,986 B2
(45) Date of Patent: Aug. 11, 2020

(54) DEVICE AND METHOD FOR ESTABLISHING ELECTRIC CONTACT BETWEEN AN ENERGY STORAGE CELL AND A CONDUCTOR PLATE STRUCTURE USING A CONDUCTOR CABLE

(71) Applicant: AUDI AG, Ingolstadt (DE)

(72) Inventor: David Vergossen, Neuburg an der Donau (DE)

(73) Assignee: AUDI AG, Ingolstadt (DE)

( * ) Notice: Subject to any disclaimer, the term of this patent is extended or adjusted under 35 U.S.C. 154(b) by 187 days.

(21) Appl. No.: 15/329,030

(22) PCT Filed: Jun. 29, 2015

(86) PCT No.: PCT/EP2015/001306
§ 371 (c)(1),
(2) Date: Jan. 25, 2017

(87) PCT Pub. No.: WO2016/015806
PCT Pub. Date: Feb. 4, 2016

(65) Prior Publication Data
US 2017/0214205 A1    Jul. 27, 2017

(30) Foreign Application Priority Data

Jul. 29, 2014    (DE) .......................... 10 2014 011 219

(51) Int. Cl.
*H01R 43/02*    (2006.01)
*H01M 2/20*    (2006.01)
(Continued)

(52) U.S. Cl.
CPC ....... *H01R 43/0207* (2013.01); *B23K 20/004* (2013.01); *B23K 20/22* (2013.01);
(Continued)

(58) Field of Classification Search
CPC ..... H01L 24/78; H01L 24/85; H01R 43/0207; B23K 20/004; B23K 20/22; H01M 2/20; H01M 2/206
See application file for complete search history.

(56) References Cited

U.S. PATENT DOCUMENTS 6,719,595 B1 *    4/2004    Welcker ................. H01R 4/023
                                                                       439/755
7,671,565 B2    3/2010    Straubel et al.
(Continued)

FOREIGN PATENT DOCUMENTS

| CN | 101855731 A | 10/2010 |
| DE | 102006054369 A1 | 5/2008 |
| WO | 2014/021141 A1 | 2/2014 |

OTHER PUBLICATIONS

Transmittal of the Translation of the International Preliminary Report on Patentability dated Feb. 9, 2017, in connection with corresponding International Application No. PCT/EP2015/001306, filed Jun. 29, 2015 (6 pgs.).
(Continued)

*Primary Examiner* — Peter Dungba Vo
*Assistant Examiner* — Jeffrey T Carley
(74) *Attorney, Agent, or Firm* — Maier & Maier, PLLC

(57) ABSTRACT

A device for establishing an electric contact between an electric energy storage cell and an electrically conductive conductor plate structure via an electrically conductive conductor wire. A tool establishes an electric contact between the electrically conductive conductor wire and the electric energy storage cell, and establishes an electric contact between the electrically conductive conductor wire and the electrically conductive conductor plate structure. The tool has a tool element that is movable through a perforation on the side of a conductor plate structure at least with its free end. In the region of the free end, a contacting
(Continued)

Figure 1:
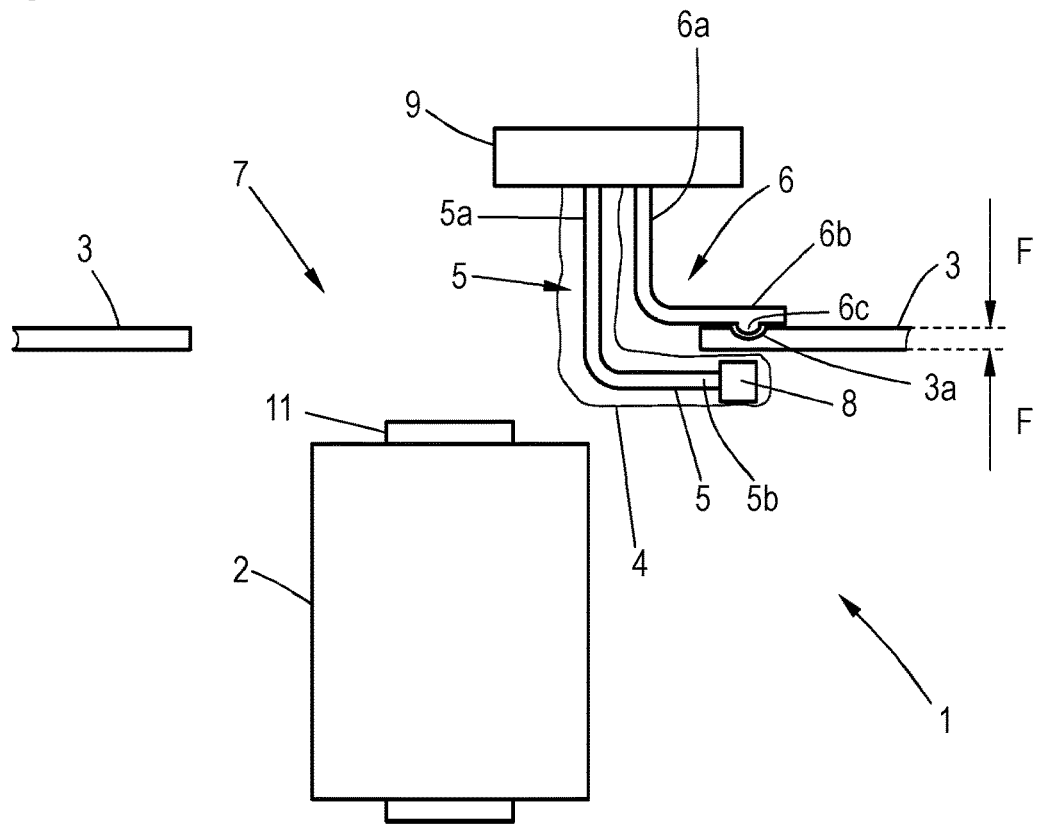

device is arranged or built for forming an electric contact between the energy storage cell.

7 Claims, 2 Drawing Sheets

(51) Int. Cl.
  *H01L 23/00*  (2006.01)
  *B23K 20/00*  (2006.01)
  *B23K 20/22*  (2006.01)
  *B23K 101/36*  (2006.01)

(52) U.S. Cl.
  CPC .............. *H01L 24/78* (2013.01); *H01L 24/85* (2013.01); *H01M 2/20* (2013.01); *H01M 2/206* (2013.01); *B23K 2101/36* (2018.08); *H01L 2224/45124* (2013.01); *H01L 2224/45144* (2013.01); *H01L 2224/45147* (2013.01); *H01L 2224/78347* (2013.01); *H01L 2924/00014* (2013.01); *H01M 2220/20* (2013.01)

(56) References Cited

U.S. PATENT DOCUMENTS

| | | | | |
|---|---|---|---|---|
| 8,444,044 | B2* | 5/2013 | Wang | B23K 20/005 |
| | | | | 228/180.5 |
| 8,511,536 | B2* | 8/2013 | Luechinger | H01L 31/18 |
| | | | | 228/180.5 |
| 8,746,537 | B2* | 6/2014 | Luechinger | B23K 20/004 |
| | | | | 228/110.1 |
| 9,585,658 | B2* | 3/2017 | Shelton, IV | A61B 17/072 |
| 2001/0042777 | A1* | 11/2001 | Kyomasu | B23K 20/004 |
| | | | | 228/180.5 |
| 2008/0241667 | A1* | 10/2008 | Kohn | H01M 2/1016 |
| | | | | 429/159 |
| 2009/0127316 | A1* | 5/2009 | Siepe | B23K 20/004 |
| | | | | 228/110.1 |
| 2010/0099024 | A1* | 4/2010 | Kim | H01M 2/206 |
| | | | | 429/164 |
| 2011/0023289 | A1* | 2/2011 | Finn | G06K 19/07722 |
| | | | | 29/601 |
| 2011/0042444 | A1* | 2/2011 | Ohnuma | H01R 4/023 |
| | | | | 228/110.1 |
| 2011/0108959 | A1* | 5/2011 | Hembree | H01L 24/81 |
| | | | | 257/621 |
| 2012/0000964 | A1* | 1/2012 | Sigler | H01M 2/206 |
| | | | | 228/111.5 |
| 2012/0141852 | A1 | 6/2012 | Eberhard et al. | |
| 2013/0200134 | A1* | 8/2013 | Byars | H01L 21/67138 |
| | | | | 228/155 |
| 2015/0364740 | A1* | 12/2015 | De Arroyabe | B23K 20/004 |
| | | | | 429/90 |
| 2018/0026250 | A1* | 1/2018 | Mattmuller | H01M 2/206 |
| | | | | 429/121 |

OTHER PUBLICATIONS

German Office Action dated Jun. 9, 2015 of corresponding application No. DE110 2014 011 219.5; 4 pgs.

International Search Report dated Dec. 4, 2015 of corresponding application No. PCT/EP2015/001306; 16 pgs.

Chinese Office Action dated Nov. 2, 2018, in connection with corresponding CN Application No. 201580041439.1 (16 pgs., including machine-generated English translation).

\* cited by examiner

DEVICE AND METHOD FOR ESTABLISHING ELECTRIC CONTACT BETWEEN AN ENERGY STORAGE CELL AND A CONDUCTOR PLATE STRUCTURE USING A CONDUCTOR CABLE

BACKGROUND

The invention relates to a device for establishing electric contact between an electric energy storage cell and an electrically conductive conductor plate structure via an electrically conductive conductor wire, comprising a tool for establishing electric contact between an electrically conductive conductor wire and an electric energy storage cell, as well as for establishing electric contact between the or a electrically conductive conductor wire and the or an electrically conductive conductor wire plate structure.

It is known that in connection with the manufacturing of electric arrangements consisting of several electric energy storage cells that are mutually interconnected with an electrically conductive conductor plate structure, i.e. in particular in connection with the manufacturing of several electric energy storage cells including energy storage cell modules, respective electric energy storage cell are contacted via electrically conductive conductor wires with the conductor plate structure.

For this purpose, a device is used that comprises a tool for establishing electric contact between an electrically conductive conductor wire and an electric energy storage cell, as well as for establishing electric contact between the or an electrically conductive conductor wire and the or a device comprising an electrically conductive conductor plate structure.

The device is associated with equipment that is formed separately from the tool, through which the energy required to form the described electric contact is provided.

The device is thus comparatively complex from the viewpoint of its technical aspects.

SUMMARY OF THE DISCLOSURE

The objective of the invention is to provide an improved device for forming electric contact between an electric energy storage cell and an electrically conductive conductor plate structure.

The objective is achieved with a device mentioned in the introduction, which is characterized in that that tool comprises a tool element that is movable at least with its free end through a perforation of the conductor plate structure, wherein on or in the region of the free end of the tool element that is movable through the conductor plate-side perforation, at least one contact-side device is arranged or formed for establishing an electric contact between the or an electrically conductive conductor wire and the or an electric energy storage cell, and for establishing an electric contact between the electrically conductive conductor wire and the or an electrically conductive conductor plate structure.

The device is generally designed or equipped in such way so as to establish or manufacture an electric contact between an electric energy storage cell and an electrically conductive conductor wire. For this purpose, the device comprises a tool for establishing an electric contact between an electrically conductive conductor wire and an electric energy storage cells, as well as for establishing an electric contact between the or an electrically conductive conductor wire and a or an electrically conductive conductor plate structure. The formation of the electrically conductive conductor wire and the electric energy storage cell, as well as the formation of the electric contact between the electrically conductive conductor wire and the electrically conductive conductor plate structure will typically take place via bonding or wire bonding; and the tool is thus typically a bonding or wire bonding tool.

The tool comprises at least one movable tool element that can be moved at least with its free end through a conductor plate-side perforation. The tool element is thus on the one hand designed, at least in the region of one free end, from the geometrical and construction viewpoint in such a way that it can be moved through a corresponding perforation or opening on the side of the conductor plate structure, i.e. through a perforation or opening formed in a conductor plate structure. On the other hand, the tool element is movably mounted via a corresponding bearing in such way that it can be moved through a corresponding perforation on the side of the conductor plate, i.e. in a conductor plate structure. The bearing thus also creates a certain possibility to realize the movement of the tool element in at least one moving and spatial direction, so that, at least in the region of the free end, it can be moved through a corresponding perforation on the side of the conductor plate. The bearing is typically associated with a drive device that is driven manually, or at least with a partially automated drive device, for example in the form of a servomotor, which makes it possible to realize the movements of the tool element.

The tool element is associated with a contacting device for establishing an electric contact between the or an electrically conductive conductor wire and the or an electric energy storage cell, as well as for establishing an electric contact between the electrically conductive conductor wire and the or an electrically conductive conductor plate structure. The actual formation of the corresponding electric contact between a corresponding energy storage cell and a corresponding conductor plate structure thus takes place via the contacting device. The required energy can thus be developed by creating the actual contact between a corresponding energy storage call and a corresponding conductor plate structure. Since as mentioned, the electric contacts are typically formed with bonding or with wire bonding, the contacting device is typically a bonding or wire bonding device.

It is essential that contacting device should be arranged or formed at or in the region of the free end of the tool element that is movable through the or in general through a conductor plate structure-side perforation, and thus directly on the tool element. The contacting device is therefore a fixed component of the tool element. The device is thus advantageously formed from the structural and technical viewpoint with a compact design.

The tool element equipped with the contacting device can be considered or referred to as the first tool element.

The contacting device is in particular designed as a vibration device for generating and/or introducing vibrations, in particular mechanical vibrations (vibrations), at least in an electrically conductive conductor wire, or so that it comprises one such device. With the vibration device it is thus possible to generate energy, in particular in the form of vibrations required to form the corresponding electric contact. The vibration device can be therefore defined as or referred to as a bonding head. The generation of the vibrations can thus take place directly or locally on the respective contacting regions to be formed. With respect to a bonding process, the generation of the oscillations required for the bonding thus takes place directly or locally on the respective contacting region.

The oscillation device can be controlled in such a way that oscillation amplitudes or frequencies can be realized with these differing oscillations. Therefore, the vibration can be matched or optimized while taking into account a concrete pairing of two joining partners, which is to say a conductor wire and a conductor plate structure.

Different technical approaches are in principle possible for generating vibrations. Piezoelectrically and magnetically generated vibrations are mentioned solely by way of an example. Accordingly, the vibration device can be designed as a piezoelectric and/or magnetic element, or at least as a piezoelectric element and at least as a magnetic element.

From the viewpoint of the construction, the tool element can be provided with an angled, in particular perpendicular pincer section projecting from an elongated base section, on which the contacting device is arranged or built. The tool element can be also provided with an L-shaped geometrical form having an elongated base section and a perpendicularly projecting pincer section from the base section. The contacting device having a pincer section, provided with or comprising the pincer section, can be considered or designated as the first pincer section of the tool.

It is expedient when the tool is designed so that it has several parts, i.e. when it advantageously includes in addition to the described (first) tool element also at least one further tool element.

A further tool element can in this case also be provided with an angled, in particular perpendicular pincer section projecting from an elongated base section. The pincer section can also form a support region for supporting another tool element on the conductor plate structure, in particular on the surface or side of a conductor plate structure facing away from the energy storage cell. The other tool element can be also provided with an angled, in particular perpendicular, L-shaped geometrical form projecting through the base section.

The pincer section, which is provided with or includes the support section, can be considered or designated as another pincer section of the tool.

The pincer section or another tool element can be provided with at least one securing projection, in particular a form-fitting encroachment in a corresponding conductor plate structure-side recess in such a way that a relative movement is prevented, in particular with respect to a sliding movement between the other tool element resting on the electrically conductive plate structure and the electrically conductive plate structure. With a corresponding securing projection it is thus possible to prevent movements, in particular sliding movements, of another tool element relating to the conductor plate structure, in particular along the conductor plate structure, and thus to realize a stable arrangement of the other tool element at or on the conductor plate structure. It is preferred when the conductor plate structure is for this purpose provided on the side of the tool element with a recesses corresponding to the securing projections, which is to say for example with a groove-like recesses. It is of course also conceivable to use the opposite principle, namely a recesses on the side of the tool element provided with corresponding projections on the side of the conductor plate structure.

It is expedient when at least two tool elements, i.e. the first tool element and at least another tool element, are movably mounted relative to each other. The movable support of the tool elements makes it possible to surround or go beyond the free region of the conductor plate structure in the state when both elements have been moved relative to each other, in particular in the area delimited by perforation on the side of the conductor plate element. Typically, the first tool element is for this purpose moved against a (lower) surface or underside of the conductor plate structure, and the or another tool element is moved against an (upper) surface or upper side of the or a conductor plate structure that is facing away from the energy storage cell, so that the overlapping or encompassing of the conductor plate structure or of the entire free region of the conductor plate structure occurs. In the state when the elements are moved relative to each other, which can be also referred to as a closed position in this respect, a certain contact pressure can be exerted, which can be required or appropriate in order to form a stable electric contact between a corresponding conductor wire and a corresponding conductor plate structure. In principle, the individual tool elements of the tool are movably mounted so that they are independent of each other, which is to say so that they can be moved independently of each other in different movement directions of spatial directions.

The invention further also relates to a method for establishing an electric contact between en electric energy storage cell and an electrically conductive conductor plate structure, wherein the electric energy storage cell is contacted via at least one electrically conductive conductor wire with the conductor plate structure. According to the method of this invention, at least one electrically conductive conductor wire is connected to establish electric contact of the electric energy storage cell with the electrically conductor plate structure by means of the device described above one a surface or on the side of the electrically conductor plate structure facing an electrical energy storage cell. In principle, in connection with the device, all embodiments applicable in connection with the method are analogous. Conversely, in connection with the device, all embodiment are also analogous in connection with the method. The invention generally relates to the formation of electrically conductive contacts or connections between at least one electric energy storage cell and at least one electrically conductor plate structure. The method is particularly applicable in connection with the formation of several energy storage cell modules, such as for example those that are used to supply electricity to vehicle-based consumers of electric energy that are built into motor vehicles.

In general, corresponding electrically conductive contacts are established between corresponding energy storage cells and the or in general a conductor plate structure according to the method, so that the respective energy storage cells are electrically contacted through at least one electrically conductive wire with the or in general a conductor wire with a conductor plate structure, i.e. electrically connected to it. The conductor plate structure can be also referred to or considered as a current collector plate.

The special feature of the method is that the corresponding conductor wires are exclusively connected to the or to a surface or side facing directly the energy storage cell to be contacted with the conductor plate structure. The electric contacting of the conductor wires is then carried out exclusively on the side of the conductor plate structure that is referred to or considered as the underside of the or of a surface or side of the conductor plate structure facing the energy storage cell. The conductor wires are thus not led through the conductor plate structure. Instead, the conductor wires are typically starting from the energy storage cell and lead directly to the surface of side of the conductor plate that is directly facing the energy storage cell.

The approach of the method described here is advantageous from the technical and manufacturing viewpoint because expensive realization of corresponding conductor wires to be led through the perforations on the conductor plate side can be avoided.

Within the scope of the method, a perforated plate structure can be used at least partially as a perforated plate structure that is formed with several perforations. Even when a similar conductor plate structure is used, which is commonly referred to or considered as a perforated plate, according to the method it is not necessary to conduct respective conductor wires through the perforation. Also in this case, the conductor wires are directly facing the surface or side facing the energy storage cell to which they are connected on the side of the conductor plate structure.

Typically, the or in general a conductor plate structure that is used within the scope of the method has a planar or flat shape. Plate-like or plate-shaped conductor plate structures are used in particular. In principle, however, corresponding conductor plate structures can be also provided with curved or arched regions, at least partially.

With regard to the electric connection or contacting of the or in general a conductor wire to the or in general an energy storage cell, it is in the context of the method preferred when the conductor wire is connected to an electric connection element, in particular a cell pole, of the electric energy storage cell. Respective energy storage cell-side electric connection elements, which is to say in particular negative or positive cell poles, are therefore expediently used as suitable contacting regions to establish electric contact of the corresponding conductor wires with the corresponding energy storage cells.

The connection of the or in general a conductor wire to the or in general an electrically conductive conductor plate structure is advantageously carried out by means of bonding or wire bonding. In principle, all bonding or wire bonding methods are suitable. In particular, the connection of the or in general a conductor wire to the or in general a conductor plate structure can thus be carried out via thermo-compression bonding, thermosonic ball-wedge bonding and ultrasonic wedge-wedge bonding.

The conductor wire used here is expediently formed from a metal that has good electric conductivity. The metal, under which term are naturally also understood metal alloys, should be suitable for use in the context of a corresponding bonding process. In particular suitable are conductor wires formed from aluminum, gold or copper, or conductor wires comprising aluminum, gold or copper. This list is mentioned only by way of an example and therefore it is not exhaustive.

It is also expedient when the used conductor plate structure is formed from a metal that has good electrical conductivity characteristics. The metal, under which term are here understood obviously also metal alloys, should be suitable for use in the context of a corresponding bonding process. Particularly suitable are therefore conductor plate structures that are formed from aluminum or comprise aluminum. Also this list is only exemplary and therefore not exhaustive.

The conductor plate structure can also consist of material having different electric conductivity, which are provided in a multi-layer or multilayered structure. However, at least the surface turned to or facing the surface or side of the energy storage cell of the conductor plate structure should be formed from a material or metal that has a good electric conductivity and that is suitable for the bonding process.

The conductor wire is used during the formation of the contact in particular as an endless wire, which can be guided around the contacting device on the side of the tool element, in particular with a contacting device equipped with a tool. The conductor wire can thus be handled easily and safely during the formation of the electric contact.

The invention further also relates to an electric arrangement comprising at least one electric storage cell and at least one electrically conductive conductor plate structure, wherein at least one electric energy storage cell is electrically contacted according to one of the methods described above with the electrically conductive conductor plate structure. All the embodiments in the context of the method are analogously applicable also to the electric arrangement.

The electric arrangement can be for example an energy storage cell module provided with one or several mutually contacted or connected energy storage cells, which is for example built into a motor vehicle to supply electric energy to energy consumers on the side of the motor vehicle.

BRIEF DESCRIPTION OF THE INVENTION

Figure 2:
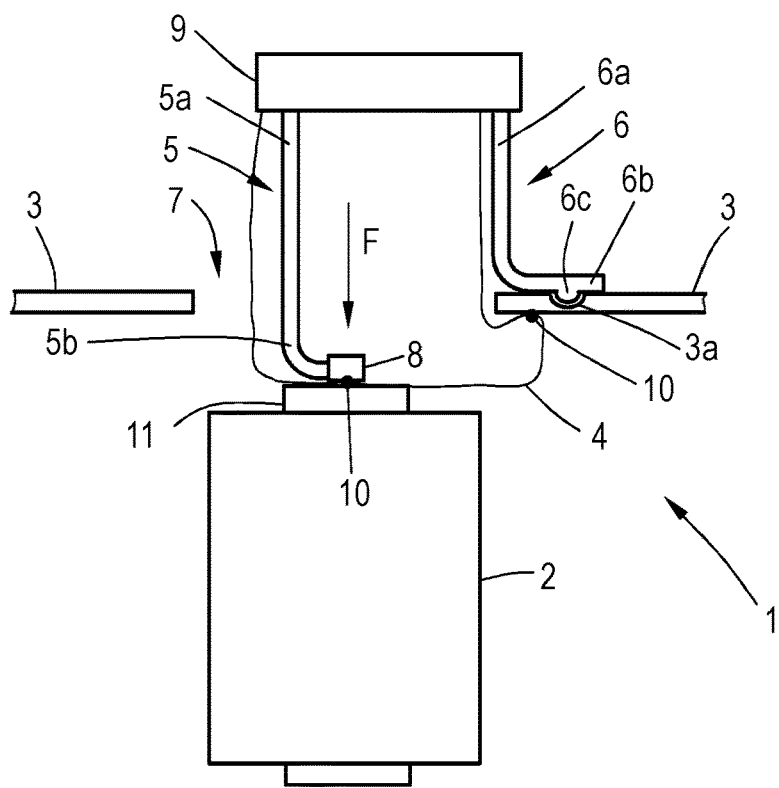
Figure 3:
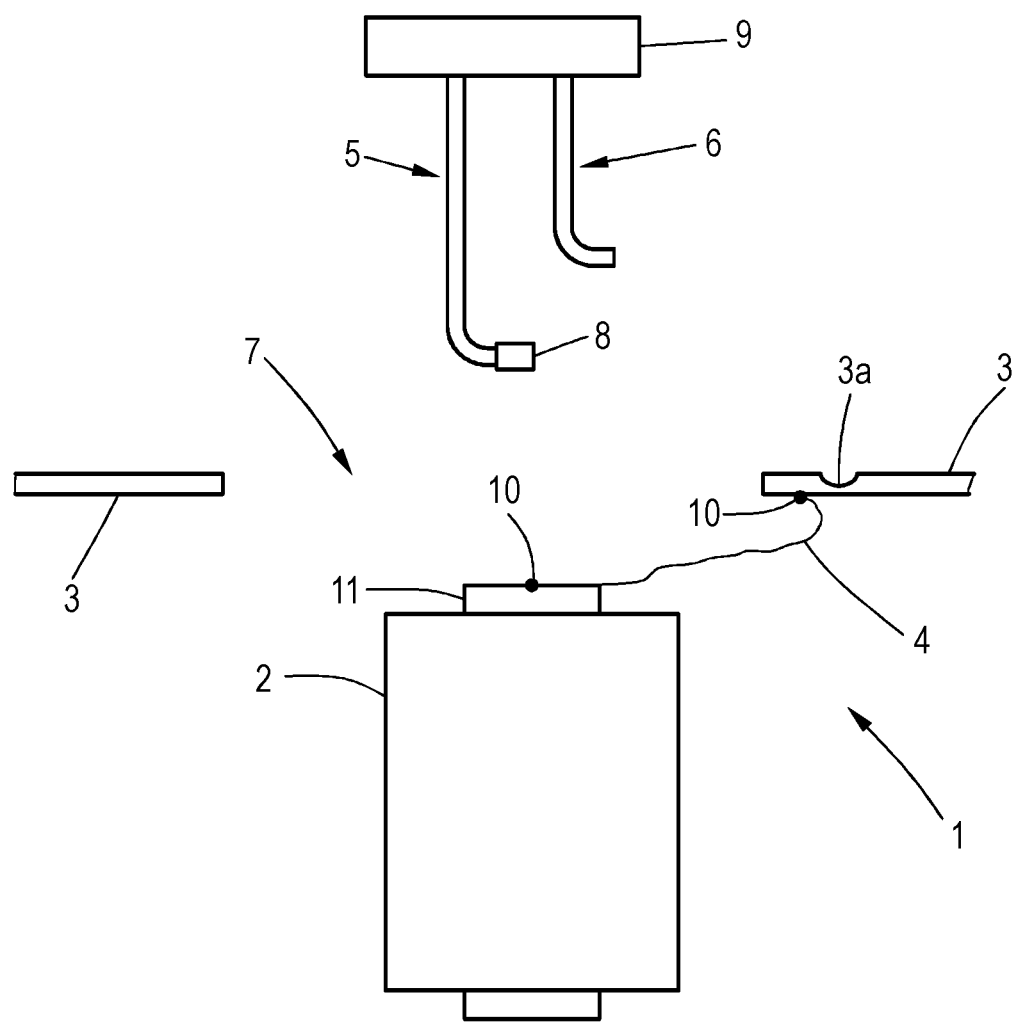

Further advantages, features and details of the invention will become evident from the embodiment described below, as well as from the figures. The figures show:

FIGS. 1-3 respective schematic representations of a device for forming an electric contact between an energy storage cell and a conductor plate structure according to one embodiment of the invention.

The FIG. 1-3 respectively show a schematic representation of a device 1 for forming an electric contact between an electric energy storage cell 2 and an electrically conductive conductor plate structure 3 according to an embodiment of the invention.

The FIGS. 1-3 thus illustrate different method stages of a method for forming an electric contact between an energy storage cell 2, which is based on lithium or a lithium compound, and a conductor plate structure 3. As can be seen, the conductor plate structure 3 is formed as a flat or plate-like perforated plate provided with multiple perforations 7, which are typically provided in a regular arrangement. The conductor plate structure 3 can be also referred to or considered as a current collector plate.

DETAILED DESCRIPTION OF THE INVENTION

The device 1 comprises a tool for establishing electric contact between an electrically conductive wire 4 and an electric energy storage cell 2, as well as for forming an electric contact between an electrically conductive wire 4 and the or an electrically conductive conductor plate structure 3.

The tool, which can be generally referred to or considered as a tool that can be used for bonding or wire bonding as will become evident from the discussion below, comprises two tool elements 5, 6. As shown in FIGS. 1, 2, a first tool element 5 penetrates through a perforation 7 on the side conductor plate structure and it is thus located with its free end directly in the region of the underside of the conductor plate structure 3 that is facing an energy storage cell 2. Another tool element 6 is located directly in the region of the upper side of the conductor plate structure 3 that is turned away from the energy cell 2, or lies on top of it.

The tool elements 5, 6 are provided with an L-shaped geometrical form having an elongated base section 5a, 6a and a pincer section 5b, 6b projecting at an angle. The respective pincer sections 5b, 6b form the respective free ends of the tool elements 5, 6.

The pincer section 5a is provided with a contacting device 8 of the tool element 5 and thus of the free end of the first tool element 5. The contacting device 8 is formed or configured to establish an electric contact between the or an electrically conductive wire 4 and the or an electrically energy storage cell 2, as well as to establish an electric contact between the electrically conductive conductor wire 4 and the or an electrically conductive conductor plate structure 3.

For this purpose, the contacting device 8 comprises a vibration device, not shown in detail, for generating and/or introducing vibrations, at least in the or in an electrically conductive wire 4. The generation of oscillations can thus be performed with the oscillation device directly or locally on the contacting region 10 that is to be formed.

The oscillation device can be designed as a piezoelectric element and/or as a magnetic element. The oscillation device can be also referred to as considered as a bonding head.

Both tool elements 5, 6 are movably mounted, namely so as to be movable relative to each other via a suitable bearing device 9 in different moving or spatial directions independent of each other.

In FIG. 1 is shown a state of the relative movement of the tool elements 5, 6 that can be referred to or considered as the end position, in which the tool elements 5, 6 overlap or surround a free region of the conductor plate structure 3 delimiting in this case a perforation 7 on the side of the conductor plate structure. In this case, the first tool element 5 is moved against a (lower) surface facing an energy storage cell 2 or underside of the conductor plate structure 3, and the tool element 6 is moved against an (upper) surface of top surface of the conductor plate structure 3 facing away from the energy storage cell 2, so that a complete overlapping or surrounding state of the conductor plate structure 3 will be created by the respective free regions of the conductor plate structure 3.

Contact pressure can be exerted, in particular of the lower tool element 5, indicated by the arrow F, with a relative movement of the tool element 5, 6 shown in FIG. 1 relative to each other, which is required or appropriate to form a stable electric contact between the conductor wire 4 and the conductor plate structure 3.

It is evident that the other tool element 6 in the region of the pincher sections 6, 5, which as shown in FIG. 1, 2 forms a support region supporting the other tool element 6 on a side of the conductor plate structure facing away from the energy storage cell 2, is provided with a securing projection 6c. The securing projection 6c penetrates, in particular in a form-fitting manner, into the corresponding recess 3a provided on the side of the conductor plate structure. The securing projection 6c thus cooperates with recess 3a on the side of the conductor plate structure in such a way that movements, in particular sliding movements of the other tool element 6 relative to the conductor plate structure 3 are prevented, in particular along the conductor plate structure 3, which makes it possible to realize a stable arrangement of at least the other tool element 6 on or on top of the conductor plate structure 3.

It is evident that the conductor wire 4, which is typically provided as endless material, is guided around the pincer section 5b of the first tool element 5. The conductor wire 4 can thus be handled easily and safely.

In FIG. 2 is shown the formation of a contact between the conductor wire 4 and the surface or side of the conductor plate structure 3 facing the energy storage cell 2 to form a contacting region 10. The contacting region 10 can be designed for example in the shape of a point or in the shape of a line. For this purpose, the conductor wire 4 is led directly by means of the tool element 5 to the surface or underside of the conductor plate structure 3 facing the energy storage cell 2. In order to form the contacting region 10 on the side of the energy storage cell, the tool element 5 is moved with a certain pressure indicated by the arrow F.

The first tool element 5 is guided in the direction of the energy storage cell 2 in order to establish there an electric contact between the conductor wire 4 and the contacting region 10 being formed for the energy storage cell 2. For this purpose, the first tool element 5 can be moved with a certain pressure against the energy storage cell 2. As shown in the figure, the contacting region 10 is formed in the region of the connecting element 11 on the side of the region of an energy storage cell, i.e. in the region of the cell pole. The contacting region 10 can be again designed in the form of a point or as a line.

As shown in FIG. 3, the excess conductor wire material is removed and an electric contact is formed between the energy storage cell 2 and side of the conductor plate structure 3 directly facing it with the contacting region 10. Also the tool is moved, which is to say the tool element 5, 6, are also moved similarly to the process described above to another position, in an analogous manner.

The method described above thus makes it possible to manufacture an electric arrangement, in particular in the form of an energy storage cell module comprising multiple electric energy storage cells 2, which can be for example built into a motor vehicle to supply a consumer of electric energy.

The conductor wires 4 shown in the figures are formed from an electrically highly conductive material, such as for instance aluminum or an aluminum alloy. The metal is suitable for use in the context of a corresponding bonding process.

Also the conductor plate structure 3 is formed from a highly electrically conductive material, such as for example copper or a copper allow. The metal is suitable for use in the context of a corresponding bonding process. The conductor plate structure 3 could also consist of several materials having different electric conductivity, which are provided in several layers or with a multi-layered construction. However, at least the surface of the conductor plate structure 3 facing the energy storage cells 2 should be formed from a material or metal that has good electric conductivity and that is suitable for use in the context of a corresponding bonding process.

Although only the upper part of the conductor plate structure 3 that is arranged above the energy storage cells 2 is shown in the figures, it is of course also possible to arrange another (lower) conductor plate structure 3 below the energy storage cells and establish a corresponding contact with the energy storage cells (2), in particular alternatively or additionally, with the (lower) conductor plate structure 3.

The electric contact would be here also established in such a way that the conductor wires 4 are connected to establish an electric contact with the electric energy storage cell 2 to the surface of the electrically conductive conductor plate structure 3 that is facing that electric energy storage cell 2.

The invention claimed is:

1. A device for forming an electric contact between an electric energy storage cell and an electrically conductive conductor plate structure via an electrically conductive conductor wire, the device comprising:

a tool for establishing electric contact between an electrically conductive conductor wire and an electric energy storage cell, as well as for establishing an electric contact between the electrically conductive conductor wire and the electrically conductive conductor plate structure, wherein the tool has a tool element that is movable at least with a free end through a perforation on the side of the conductor plate structure, wherein proximate to or in the region of the free end of the tool element that is movable through the conductor plate structure perforation, at least one contacting device is arranged or formed for establishing an electric contact between the electrically conductive conductor wire and the electric energy storage cell, as well as for establishing electric contact between the electrically conductive conductor wire and the electrically conductive conductor plate structure, wherein the tool further has a second tool element, and the tool element and the second tool element are mounted on a bearing device and are movable relative to each other, wherein the tool element is L shaped having an elongated base section and a perpendicular pincer section forming the free end, and wherein the second tool element is L shaped having an elongated base section and a perpendicular pincer section, the elongated base section of the tool element being parallel to and longer than the elongated base section of the second tool element, and wherein the contacting device has a top surface facing the pincer section of the second tool element and, when the tool element and second tool element are disposed on opposite sides of the conductor plate structure, the top surface of the contacting device is configured to form a contact between the electrically conductive conductor wire on a surface of the electrically conductive conductor plate structure and a bottom surface of the contacting device is configured to form a contact between the electrically conductive conductor wire on a surface of the electric energy storage cell facing the surface of the electrically conductive conductor plate structure.

2. The device according to claim 1, wherein the at least one contacting device is formed as a vibration device for the generation and introduction of vibrations at least in the electrically conductive conductor wire.

3. The device according to claim 2, wherein the vibration device is designed as at least one of a piezoelectric element or a magnetic element.

4. The device according to claim 1, wherein the tool element is provided with the pincer section projecting at an angle from the elongated base section, on which the at least one contacting device is arranged or formed.

5. The device according to claim 1 wherein the second tool element, which forms the pincer section projecting at an angle from the elongated base section, forms a support region for supporting other tool elements on a surface facing the energy storage or conductor plate structure.

6. The device according to claim 5, wherein the pincer section of the second tool element is provided with at least one securing projection penetrating into a corresponding recess on the side of the conductor plate structure in such a way that a relative movement is prevented between the second tool element lying on the electrically conductive conductor plate structure and the electrically conductive conductor plate structure.

7. The device according to claim 5, wherein both tool elements are mounted so as to be movable relative to each other in such a way that in a state in which they have been moved relative to each other, they surround a free region of the conductor plate structure, delimiting a perforation on the side of the conductor plate element.

\* \* \* \* \*